(12) United States Patent
Tseng et al.

(10) Patent No.: US 9,201,195 B2
(45) Date of Patent: Dec. 1, 2015

(54) METHOD AND STRUCTURE FOR REDUCING LIGHT CROSSTALK IN INTEGRATED CIRCUIT DEVICE

(71) Applicant: Taiwan Semiconductor Manufacturing Company, Ltd., Hsin-Chu (TW)

(72) Inventors: Allen Tseng, Kao Hsiung (TW); Che-Min Lin, Tainan (TW); Zen-Fong Huang, Tainan (TW); Volume Chien, Sinying (TW); Chi-Cherng Jeng, Madou Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 89 days.

(21) Appl. No.: 13/930,717

(22) Filed: Jun. 28, 2013

(65) Prior Publication Data

US 2015/0003777 A1     Jan. 1, 2015

(51) Int. Cl.
| G02B 6/30 | (2006.01) |
| G02B 6/32 | (2006.01) |
| G02B 6/12 | (2006.01) |
| H01L 27/146 | (2006.01) |
| G02B 27/00 | (2006.01) |
| G02B 5/20 | (2006.01) |

(52) U.S. Cl.
CPC ........ *G02B 6/12007* (2013.01); *G02B 27/0018* (2013.01); *H01L 27/14621* (2013.01); *H01L 27/14627* (2013.01); *H01L 27/14629* (2013.01); *H01L 27/14685* (2013.01); *G02B 5/201* (2013.01)

(58) Field of Classification Search
CPC ................. G02B 6/12007; G02B 6/13; H01L 27/14625; H01L 27/14683
USPC ....................................... 385/33, 49
See application file for complete search history.

(56) References Cited

U.S. PATENT DOCUMENTS

| 7,189,957 B2 * | 3/2007 | Fu et al. ..................... 250/214.1 |
| 7,491,923 B2 * | 2/2009 | Tani ........................... 250/208.1 |
| 2006/0115230 A1 * | 6/2006 | Komoguchi et al. ......... 385/146 |
| 2011/0266645 A1 * | 11/2011 | Chao ............................. 257/432 |

* cited by examiner

*Primary Examiner* — Ryan Lepisto
(74) *Attorney, Agent, or Firm* — Haynes and Boone, LLP

(57) ABSTRACT

The present disclosure provides an integrated circuit device comprising a substrate having a back surface and a sensing region disposed in the substrate and being operable to sense radiation projected towards the back surface of the substrate. The device further includes a waveguide disposed over the back surface of the substrate. The waveguide is aligned with the sensing region such that the waveguide is operable to transmit the radiation towards the aligned sensing region. The waveguide includes a waveguide wall, and an inner region disposed adjacent to the waveguide wall. A diffractive index of the waveguide wall is less than a diffractive index of the inner region.

20 Claims, 8 Drawing Sheets

METHOD AND STRUCTURE FOR REDUCING LIGHT CROSSTALK IN INTEGRATED CIRCUIT DEVICE

BACKGROUND

Integrated circuit (IC) technologies are constantly being improved. Such improvements frequently involve scaling down device geometries to achieve lower fabrication costs, higher device integration density, higher speed, and better performance. Along with the advantages realized from reducing geometry size, improvements are being made directly to the IC devices. One such IC device is an image sensor device. An image sensor device includes a pixel array for detecting light and recording intensity (brightness) of the detected light. The pixel array responds to the light by accumulating a charge—the more light, the higher the charge. The charge can then be used (for example, by other circuitry) to provide a color and brightness that can be used for a suitable application, such as a digital camera. Common types of pixel grids include a charge-coupled device (CCD) image sensor or complimentary metal-oxide-semiconductor (CMOS) image sensor device.

One type of image sensor device is a backside illuminated (BSI) image sensor device. BSI image sensor devices are used for sensing a volume of light projected towards a backside surface of a substrate (which supports the image sensor circuitry of the BSI image sensor device). The pixel array is located at a front side of the substrate and the substrate is thin enough so that light projected towards the backside of the substrate can reach the pixel array. BSI image sensor devices provide a high fill factor and reduced destructive interference, as compared to front-side illuminated (FSI) image sensor devices. However, due to device scaling, improvements to BSI technology are continually being made to further improve BSI image sensor device quantum efficiency. Accordingly, although existing BSI image sensor devices and methods of fabricating these BSI image sensor devices have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
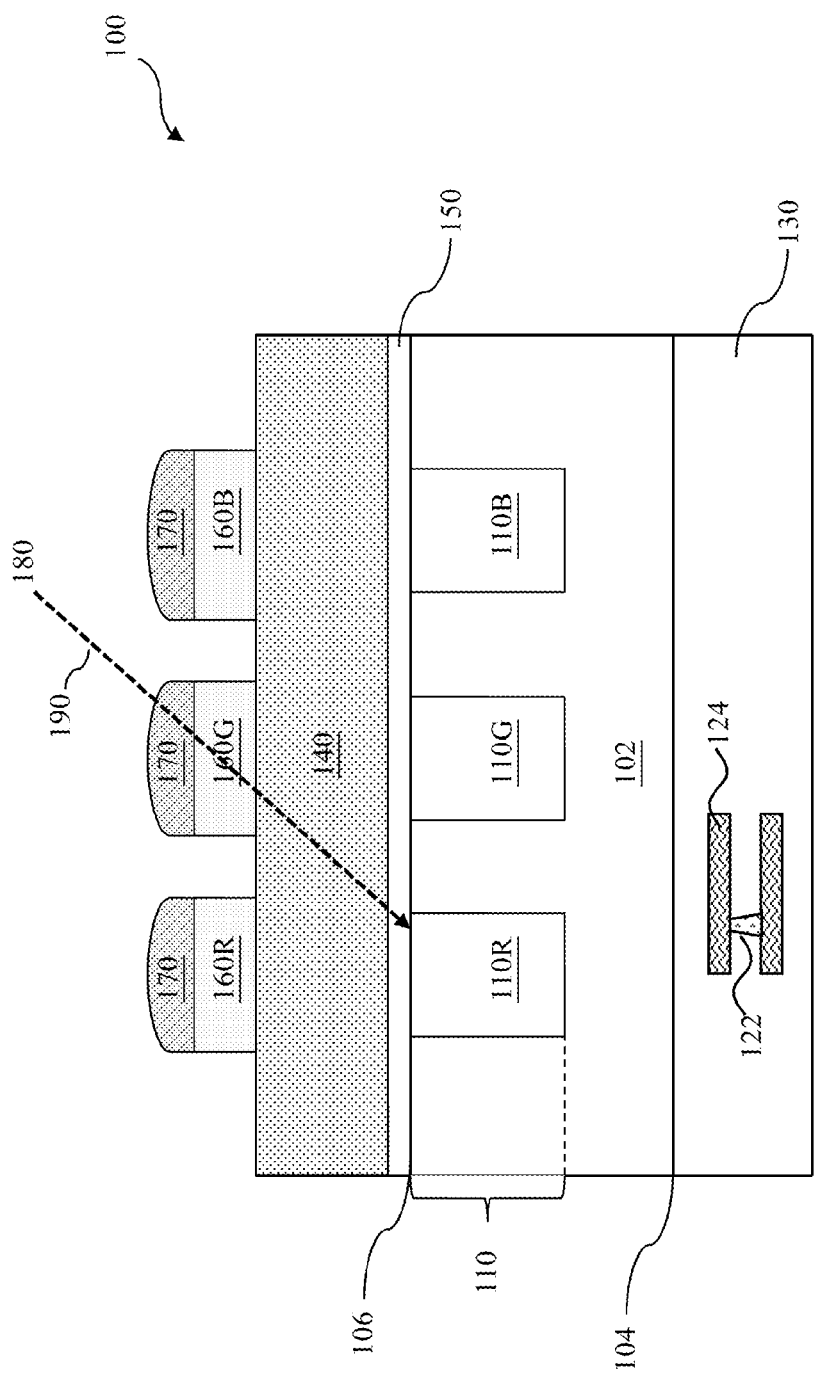
FIG. 1 is a diagrammatic sectional side view of an integrated circuit device according to some aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a diagrammatic sectional side view of an integrated circuit device 100 according to some aspects of the present disclosure. In some embodiments, integrated circuit device 100 includes a substrate 102 with a front surface 104 and a back surface 106. One or more sensor elements 110 (e.g., light sensing regions 110 red (R), 110 green (G) and 110 blue (B)) are disposed in substrate 102. In some embodiments, a dielectric layer 140 is disposed over back surface 106 of substrate 102. In some embodiments, integrated circuit device 100 may include an antireflective layer 150 disposed between dielectric layer 140 and back surface 106 of substrate 102. In some embodiments, the integrated circuit device 100 further includes various conductive features 122 and 124 disposed over front surface 104 of substrate 102.

In some embodiments, one or more color filters 160 (e.g., color filter 160 red (R), 160 green (G) and 160 blue (B)) are disposed over dielectric layer 140. One or more color filters 160 are designed so that each may filter through light of a predetermined wavelength. For example, color filter 160R aligned with light sensing region 110R may be configured to filter through visible light of a red wavelength to light sensing region 110R, color filter 160G aligned with light sensing region 110G may be configured to filter through visible light of a green wavelength to light sensing region 110G, or color filter 160B aligned with light sensing region 110B may be configured to filter through visible light of a blue wavelength to light sensing region 110B. Integrated circuit device 100 may further include one or more lenses 170 disposed over dielectric layer 140.

FIG. 1 further illustrates a light travel path 190 in integrated circuit device 100. In some embodiments, a radiant, such as an incident light 180, passes through one lens 170 at a certain angle. Color filter 160G may filter through the light of a green wavelength along a path 190 to dielectric layer 140. However instead of being transmitted to light sensing region 110G, the filtered light may be transmitted to light sensing region 110R along path 190, as illustrated in FIG. 1. Such kind of light crosstalk may lose light concentration and reduce quantum efficiency in integrated circuit device 100.

Figure 2A:
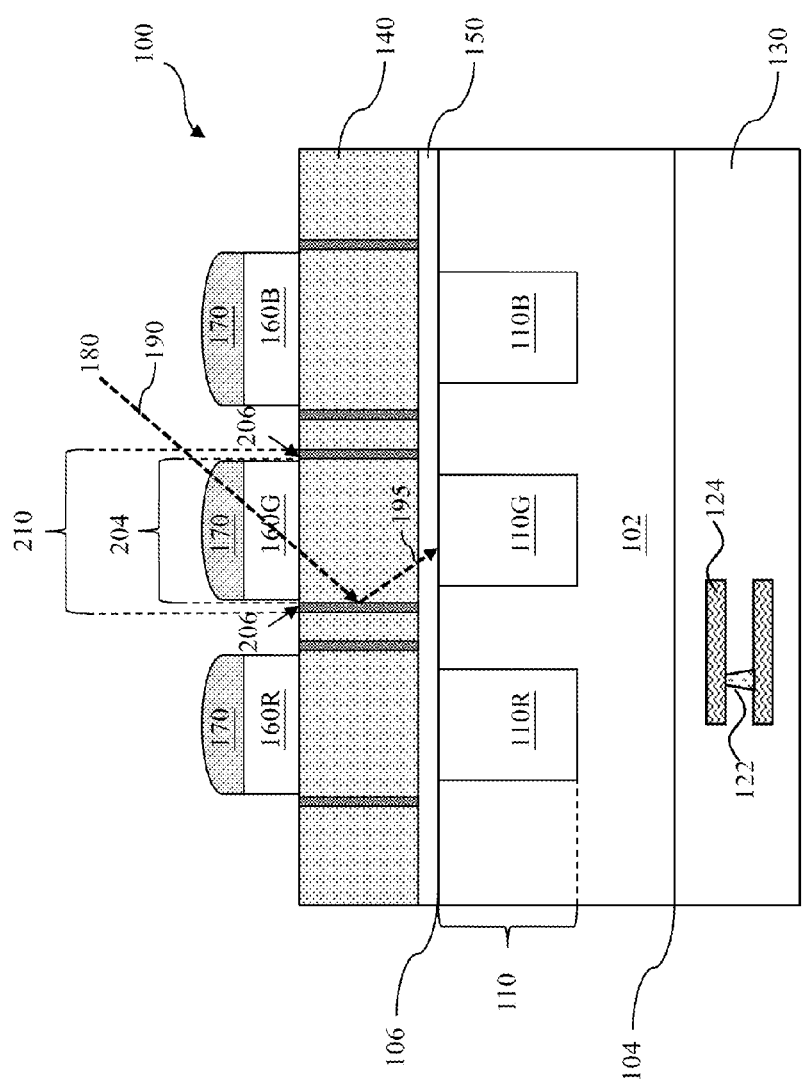
FIG. 2A is diagrammatic sectional side view of an integrated circuit device including a waveguide according to some aspects of the present disclosure.

FIG. 2A is a diagrammatic sectional side view of an integrated circuit device including a waveguide according to some aspects of the present disclosure. In some embodiments, integrated circuit device 100 includes a backside illuminated (BSI) image sensor device. The integrated circuit device 100 may be an integrated circuit (IC) chip, system on chip (SoC), or portion thereof, that includes various passive and active microelectronic components, such as resistors, capacitors, inductors, diodes, metal-oxide-semiconductor field effect transistors (MOSFET), complementary MOS (CMOS) transistors, bipolar junction transistors (BJT), laterally diffused MOS (LDMOS) transistors, high power MOS transistors, fin-like field effect transistors (FinFET), other suitable components, or combinations thereof. FIG. 2A has been simplified for the sake of clarity to better understand the inventive concepts of the present disclosure. Additional features can be added in the integrated circuit device 100, and some of the features described below can be replaced or eliminated for other embodiments of integrated circuit device 100.

In some embodiments, the integrated circuit device 100 includes a substrate 102 having a front surface 104 and a back surface 106. In one embodiment, the substrate 102 is a semiconductor substrate including silicon. The substrate 102 may be a semiconductor substrate including silicon. Alternatively or additionally, the substrate 102 may include another elementary semiconductor, such as germanium and/or diamond; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 102 may be a semiconductor on insulator (SOI). The substrate 102 may include a doped epi layer, a gradient semiconductor layer, and/or a semiconductor layer overlying another semiconductor layer of a different type, such as a silicon layer on a silicon germanium layer.

In some embodiments, the substrate may be a p-type or an n-type substrate depending on design requirements of the integrated circuit device 100. In some examples, p-type substrate is doped with include boron, gallium, indium, other suitable p-type dopants, or combinations thereof. Integrated circuit device 100 may alternatively include an n-type doped substrate. In some example, n-type substrate is doped with phosphorus, arsenic, other suitable n-type dopants, or combinations thereof. In some embodiments, substrate 102 may include various doped regions, such as p-type doped regions and/or n-type doped regions configured and coupled to form various devices and functional features. All doping features may be achieved using a suitable process, such as ion implantation in various steps and techniques.

Substrate 102 may include isolation features (not illustrated), such as local oxidation of silicon (LOCOS) and/or shallow trench isolation (STI), to separate (or isolate) various regions and/or devices formed on or within substrate 102. The isolation features may include silicon oxide, silicon nitride, silicon oxynitride, other suitable materials, or combinations thereof. The isolation features can be formed by any suitable process. For example, forming an STI includes a photolithography process, etching a trench in the substrate (for example, by using a dry etching and/or wet etching), and filling the trench (for example, by using a chemical vapor deposition process) with dielectric material. The filled trench may have a multi-layer structure, such as a thermal oxide liner layer filled with silicon nitride or silicon oxide.

Substrate 102 may also include additional layers, such as oxides, dielectrics, polysilicon, metal, and so forth, formed on or near the top surface 104, as is well known in the art.

In some embodiments according to FIG. 2A, the integrated circuit device 100 includes one or more sensor elements 110. In some embodiments, sensor elements 110 are configured to detect an intensity (brightness) of radiation, such as an incident light 180, directed toward back surface 106 of substrate 102. In one embodiment, incident light 180 is visual light. Alternatively, incident light 180 could be infrared (IR), ultraviolet (UV), X-ray, microwave, other suitable radiation type, or combinations thereof. In some embodiments, sensor elements 110 are configured to correspond with a specific light wavelength, such as a red (R), a green (G), or a blue (B) light wavelength. Sensor elements 110 may be configured to detect intensity (brightness) of a particular light wavelength.

In some embodiments, sensor elements 110 include a photodetector, such as a photodiode. Sensor elements 110 may include light sensing regions (or photo-sensing region) 110R, 110G, and 110B, which detect intensity (brightness) of red, green, and blue light wavelengths, respectively. Light sensing regions (or photo-sensing regions) 110R, 110G, and 110B are doped regions having n-type and/or p-type dopants formed in substrate 102. In some embodiments, light sensing regions 110R, 110G, and 110B may be n-type doped regions. Light sensing regions 110R, 110G, and 110B may be formed by a method such as diffusion and/or ion implantation. Sensor elements 110 may further include one or more pinned layers. In one example, sensor elements 110 may include a pinned layer disposed in substrate 102 at front surface 104. In one example, sensor elements 110 may include a pinned layer disposed in substrate 102 at back surface 106. In another example, sensor elements 110 may include pinned layers disposed in substrate 102 at both front surface 104 and back surface 106. For example, sensor elements 110 are disposed between the pinned layers disposed respectively at the front and back surfaces of the substrate. The pinned layers are doped layers, which may be doped n-type or p-type depending on design requirements of sensor elements 110. Sensor elements 110 may further include various transistors, such as a transfer transistor (not illustrated), a reset transistor (not illustrated), a source-follower transistor (not illustrated), a select transistor (not illustrated), other suitable transistors, or combinations thereof. Light sensing regions 110R, 110G, and 110B and various transistors (which can collectively be referred to as pixel circuitry) may allow sensor elements 110 to detect intensity of the particular light wavelength. Additional circuitry, input, and/or outputs may be provided to sensor elements 110 to provide an operation environment for sensor elements 110 and/or support communication with sensor elements 110.

In some embodiments, integrated circuit device 100 further includes various conductive features disposed over the front surface 104 of substrate 102. In some embodiments, various conductive features are coupled to various components of the BSI image sensor device, such as sensor elements 110, such that the various components of the BSI image sensor device are operable to properly respond to illuminated light (imaging radiation). Various conductive features may be vertical interconnects, such as contacts and/or vias 122, and/or horizontal interconnects, such as lines 124. The various conductive features 122 and 124 may include conductive materials, such as metal. In an example, metals including aluminum, aluminum/ silicon/copper alloy, titanium, titanium nitride, tungsten, polysilicon, metal silicide, or combinations thereof, may be used, and various conductive features 122 and 124 may be referred to as aluminum interconnects. Various conductive features 122 and 124 may be formed by a process including physical vapor deposition (PVD), chemical vapor deposition (CVD), or combinations thereof. Other manufacturing techniques to form various conductive features 122 and 124 may include photolithography processing and etching to pattern conductive materials to form the vertical and horizontal interconnects. The metal silicide used in the multilayer interconnects may include nickel silicide, cobalt silicide, tungsten silicide, tantalum silicide, titanium silicide, platinum silicide, erbium silicide, palladium silicide, or combinations thereof. Alternatively, various conductive features 122 and 124 may be copper multilayer interconnects, which include copper, copper alloy, titanium, titanium nitride, tantalum, tantalum nitride, tungsten, polysilicon, metal silicide, or combinations thereof. It is understood that conductive features 122 and 124 are not limited by the number, material, size, and/or dimension depicted, and thus, conductive features 122 and 124 may include any number, material, size, and/or dimension of conductive features depending on design requirements of the integrated circuit device 100.

In some embodiments, various conductive features 122 and 124 are disposed in an interlayer (or inter-level) dielectric (ILD) layer 130. ILD layer 130 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other suitable materials, or combinations thereof. ILD layer 130 may have a multilayer structure. ILD layer 130 may be formed by a technique including spin-on coating, CVD, PVD, sputtering, or other suitable processes. In an example, ILD 130 may be formed in an integrated process including a damascene process, such as a dual damascene process or single damascene process.

In some embodiments, a carrier wafer (not illustrated) may be disposed on the device 100. For example, the carrier wafer may be bonded to ILD layer 130. The carrier wafer may include silicon. Alternatively, the carrier wafer may include another suitable material, such as glass. The carrier wafer can provide protection for the various features (such as sensor elements 110) formed on front surface 104 of substrate 102, and can also provide mechanical strength and support for processing back surface 106 of substrate 102.

Referring to FIG. 2A, integrated circuit device 100 includes a dielectric layer 140 disposed over the back surface 106 of substrate 102. A waveguide 210 is disposed in dielectric layer 140 and extends along a vertical direction as illustrated in FIG. 2A. In some embodiments, waveguide 210 includes a waveguide wall 206 and an inner region 204 disposed between two adjacent waveguide walls 206. Inner region 204 includes a first dielectric material, and waveguide wall 206 includes a second dielectric material. A refractive index ($n_1$) of the first dielectric material is essentially the same or greater than a refractive index ($n_2$) of the second dielectric material. In some embodiments, inner region 204 and waveguide wall 206 are designed such that waveguide 210 may essentially confine light 180 within inner region 204 as the light travels through waveguide. In some embodiments, inner region 204 and waveguide wall 206 are designed such that light 180 being transmitted in waveguide 210 can form total internal reflection, as illustrated as paths 190 and 195 in FIG. 2A. Light 180 may be confined by waveguide 210 within inner region 204 due to the total internal reflection. In one embodiment, inner region 204 and dielectric layer 140 include the same dielectric material. Alternatively, inner region 204 and dielectric layer 140 may include different dielectric materials.

In some embodiments, waveguide 210 is aligned with a corresponding color filter 160 (e.g., color filter 160G) such that light being filtered through the aligned color filter (e.g., color filter 160G) may enter waveguide 210. In some embodiments, waveguide 210 is aligned with a corresponding sensor element 110 (e.g., light sensing region 110G) such that light being transmitted from waveguide 210 may enter a corresponding sensor element 110 (e.g., light sensing region 110G). In some embodiments, waveguide 210 is designed such that light being filtered through the aligned color filter (e.g., color filter 160G) and being transmitted in waveguide 210, may be directed to the aligned light sensing region (e.g., light sensing region 110G). For example, in one embodiment as illustrated in FIG. 2A, incident light 180 is transmitted through lens 170 at a certain angle. Color filter 160G may filter through the light of a green wavelength along a path 190 to dielectric layer 140. When transmitted in inner region 204, light 180 may reach waveguide wall 206. Due to a smaller refractive index ($n_2$) of waveguide wall 206 compared to the refractive index ($n_1$) of inner region 204, total reflection occurs to light 180 as shown as path 195 in FIG. 2A. Therefore light 180 may be further directed to sensor element 110G without forming crosstalk in integrated circuit device 100.

Still referring to FIG. 2A, in some embodiments, the width of inner region 204 is essentially the same as or greater than the width of the aligned color filter 160 (e,g., color filter 160G), such that light being filtered through the aligned color filter (e,g., color filter 160G) may enter inner region 204 of waveguide 210. In some embodiments, the width of inner region 204 may be essentially the same or greater than the width of the aligned light sensing region 110 (e.g., light sensing region 110G), such that light being transmitted from waveguide 210 may enter the aligned light sensing region (e.g., light sensing region 110G). In some embodiments, waveguide 210 may extend from the upper surface of dielectric layer 140 to the lower surface of dielectric layer 140. Alternatively, waveguide 210 may not extend from the upper surface of dielectric layer 140 to the lower surface of dielectric layer 140.

Figure 2B:
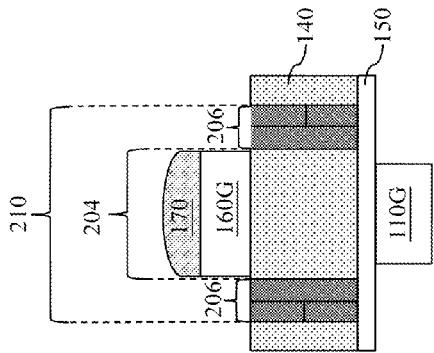
FIGS. 2B-2G are enlarged sectional side views of a waveguide in an integrated circuit device of various aspects of the present disclosure.
Figure 2E:
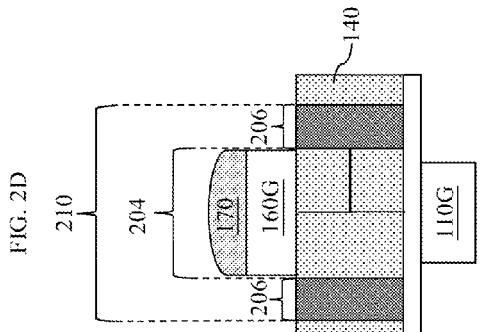
Figure 2C:
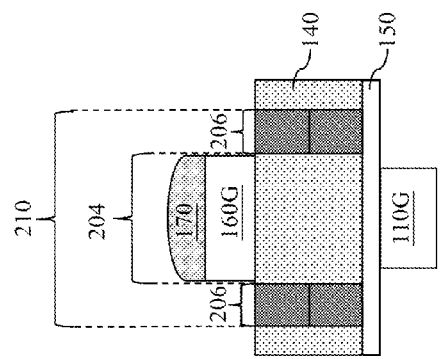
Figure 2F:
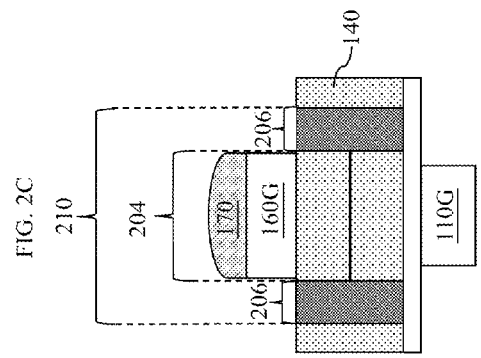
Figure 2D:
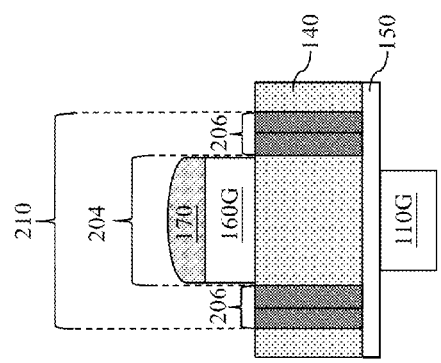

FIGS. 2B-2G illustrate enlarged sectional side views of a waveguide in an integrated circuit device of various aspects of the present disclosure. In some embodiments referring to FIGS. 2B-2D, waveguide wall 206 may include one or more layers. The one or more layers are designed such that light traveling in waveguide 210 may be essentially confined within waveguide 210. For example, light traveling in waveguide 210 may be reflected and/or refracted by one or more layers of waveguide wall 206 such that light may be essentially confined within waveguide 210. In some embodiments, waveguide wall 206 is formed with multiple layers with different layouts. For example as shown in FIG. 2B, waveguide wall 206 includes an inner layer formed by one dielectric material and an outer layer formed by another dielectric material. In another example as shown in FIG. 2C, waveguide wall 206 includes an upper layer formed by one dielectric layer and a lower layer formed by another dielectric layer. In yet another example as shown in FIG. 2D, waveguide wall 206 includes a combined layout of both horizontally and vertically disposed layers, such as an inner layer formed by one dielectric material, an outer upper layer formed by another dielectric material, and an outer lower layer formed by yet another dielectric material. In some embodiments, the one or more layers of waveguide wall 206 may form a film stack.

Figure 2G:
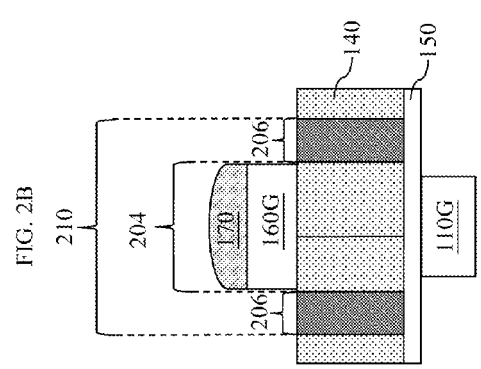

Referring to FIGS. 2E-2G, inner region 204 may include one or more layers. The one or more layers are designed such that light traveling in waveguide 210 may be essentially confined within waveguide 210. In some embodiments, inner region 204 is formed with multiple layers with different layouts. For example as shown in FIG. 2E, inner region 204 includes multiple dielectric layers arranged vertically. In another example as shown in FIG. 2F, inner region 204 includes multiple dielectric layers arranged horizontally. In yet another example as shown in FIG. 2G, inner region 204 includes a combined layout of both horizontally and vertically disposed dielectric layers. As discussed above, one or more layers of waveguide wall 206 and/or one or more layers of inner region 204 of waveguide 210 may be designed in different embodiments configured to achieve good light confinement by reducing crosstalk and/or light scattering, such that improved quantum efficiency and improved color separation can be provided in the integrated circuit device 100. Although two or three layers with different layouts are illustrated in FIGS. 2B-2G, a person having ordinary skill in the art would be able to understand that any number of layers may be included in waveguide wall 206 and/or inner region 204 in any suitable arrangement.

The one or more layers may have different dielectric materials with different diffractive indexes from each other. In some embodiments, the one or more layers are disposed such that the diffractive indexes increase from outer layer towards inner layer of waveguide wall 206. In some embodiments, the refractive index of inner region 204 is greater than the refractive index of any layer of waveguide 206. Alternatively, the one or more layers of waveguide 206 and inner region 204 with different refractive indexes are arranged in various embodiments such that light traveling in waveguide 210 may be essentially confined within waveguide 210.

The integrated circuit device 100 may further include various features disposed over back surface 106 of substrate 102. For example, an antireflective layer 150 is disposed between dielectric layer 140 and back surface 106 of substrate 102. The antireflective layer 150 includes a dielectric material, such as silicon nitride, silicon oxide, and/or silicon oxynitride.

The integrated circuit device 100 further includes one or more color filters 160 disposed over dielectric layer 140. The color filters 160R, 160G and 160B are aligned with light sensing regions 110R, 110G, and 110B of the sensor elements 110, respectively. One or more color filters 160 are designed so that each may filter through light of a predetermined wavelength. For example, color filter 160R is aligned with light sensing region 110R and is configured to filter through visible light of a red wavelength to light sensing region 110R, color filter 160G is aligned with light sensing region 110G and is configured to filter through visible light of a green wavelength to light sensing region 110G, and color filter 160B is aligned with light sensing region 110B and is configured to filter through visible light of a blue wavelength to light sensing region 110B. Color filters 160 may include any suitable material. In one example, color filters 160 include a dye-based (or pigment-based) polymer for filtering out a specific frequency band (for example, a desired wavelength of light). Alternatively, color filters 160 may include a resin and/or other organic-based material having color pigments.

The integrated circuit device 100 may include lenses 170 disposed over the back surface 106 of substrate 102. The lenses 170 may be disposed over color filters 160 and aligned with respective light sensing regions 110R, 110G, and 110B of sensor elements 110. Lenses 170 may be in various positional arrangements with sensor elements 110 and/or color filters 160, such that lenses 170 focus incident light 180 on the respective light sensing regions 110R, 110G, and 110B of sensor elements 110. Lenses 170 include a suitable material, and may have a variety of shapes and sizes depending on a refractive index of the material used for the lenses and/or a distance between the lenses and sensor elements 110. Alternatively, the position of color filters 160 and lenses 170 may be reversed, such that lenses 170 are disposed between back surface 106 of substrate 102 and color filters 160. In some embodiments, integrated circuit device 100 may have a color filter layer disposed between lens layers.

Referring also to FIG. 2A, in some embodiments, integrated circuit device 100 is designed to receive incident light 180 traveling towards back surface 106 of substrate 102. In some embodiments, lenses 170 direct incident light 180 to the respective color filters 160 (e.g., color filter 160R, 160G, and 160B). Light then passes from the respective color filters 160 towards dielectric layer 140. Light passing through dielectric layer 140 may be confined and/or maximized due to various features in dielectric layer 140, such as waveguide 210. In some embodiments, light passing through waveguide 210 encounter total internal reflection as illustrated as paths 190 and 195 in FIG. 2. After passing through dielectric layer 140, light may then be transmitted through antireflective layer 150 to substrate 102 and/or aligned light sensing regions 110R, 110G, and 110B of sensor elements 110, respectively. As discussed above, waveguide 210 may reduce photon crosstalk and/or scattering in integrated circuit device 100. The desired wavelengths of light (for example, red, green, and blue light) may be more efficiently allowed to pass through to the respective light sensing regions 110R, 110G, and 110B of sensor elements 110, respectively. When exposed to the light, light sensing regions 110R, 110G, and 110B of sensor elements 110 may produce and/or accumulate (collect) electrons, which may be converted to various signals, such as voltage signals.

Figure 3:
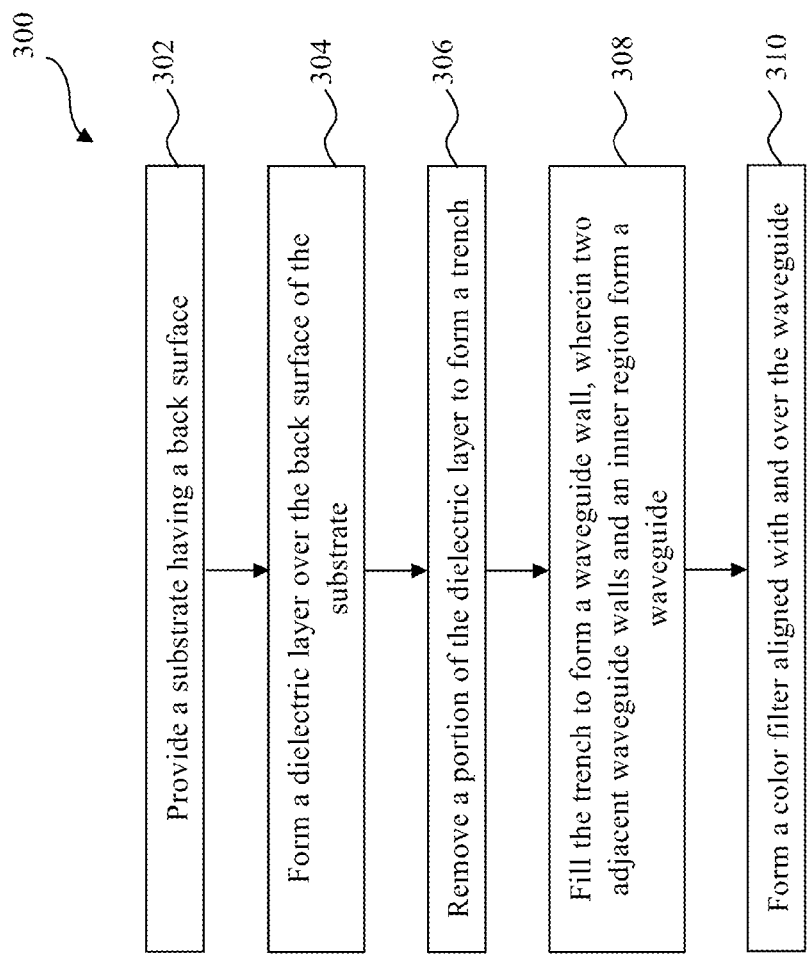
FIG. 3 is a flow chart of a method for fabricating an integrated circuit device having a waveguide according to some aspects of the present disclosure.

FIG. 3 is a flow chart of a method 300 for fabricating an integrated circuit device having a waveguide according to some embodiments of the present disclosure. Additional steps can be provided before, during, and after the method 300, and some of the steps described can be replaced or eliminated for other embodiments of the method 300.

FIGS. 4A-4D are diagrammatic sectional side views of an integrated circuit device 100 including a waveguide at various fabrication stages of method 300 according to aspects of the present disclosure. FIGS. 4A-4D have been simplified for the sake of clarity to better understand the inventive concepts of the present disclosure. Additional features can be added in integrated circuit device 100, and some of the features described below can be replaced or eliminated for additional embodiments of integrated circuit device 100.

Figure 4A:
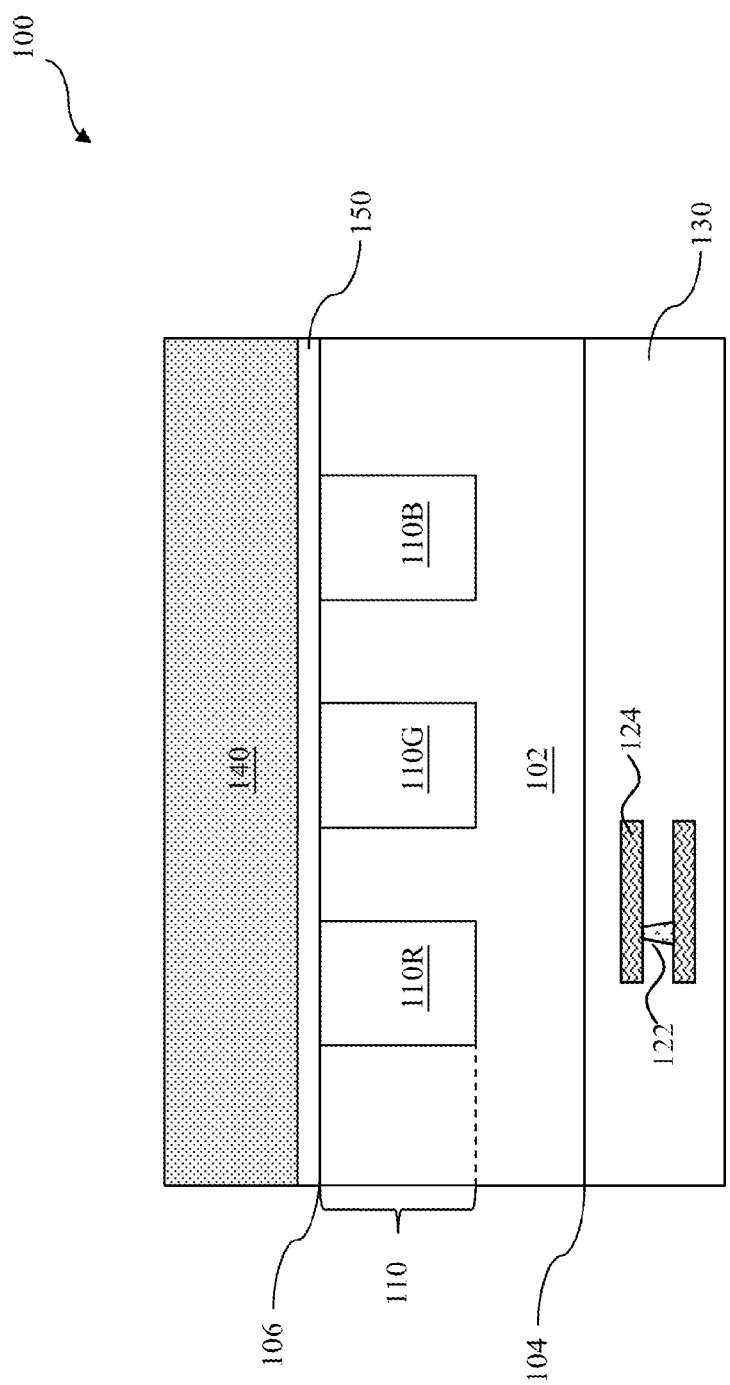
FIGS. 4A-4D are diagrammatic sectional side views of an integrated circuit device including a waveguide at various fabrication stages according to some aspects of the present disclosure.

Referring to FIGS. 3 and 4A, the method 300 begins at step 302 by providing a substrate 102 with a back surface 106. A sensing region (e.g., sensing region 110G) is disposed in substrate 102 and operable to sense radiation projected towards back surface 106 of substrate 102.

Still referring to FIGS. 3 and 4A, the method 300 proceeds to step 304 by forming a dielectric layer 140 over back surface 106 of substrate 102. Dielectric layer 140 includes a first dielectric material. The first dielectric material may include oxide, nitride, oxynitride, other suitable dielectric materials, and/or combinations thereof. Dielectric layer 140 may be formed by CVD, PVD, atomic layer deposition (ALD), or other suitable methods, and/or combinations thereof. In some embodiments, before forming dielectric layer 140, an antireflection layer 150 may be formed over back surface 106 of substrate 102. Antireflective layer 150 may be formed using suitable techniques such as CVD, PVD and/or the like.

Figure 4B:
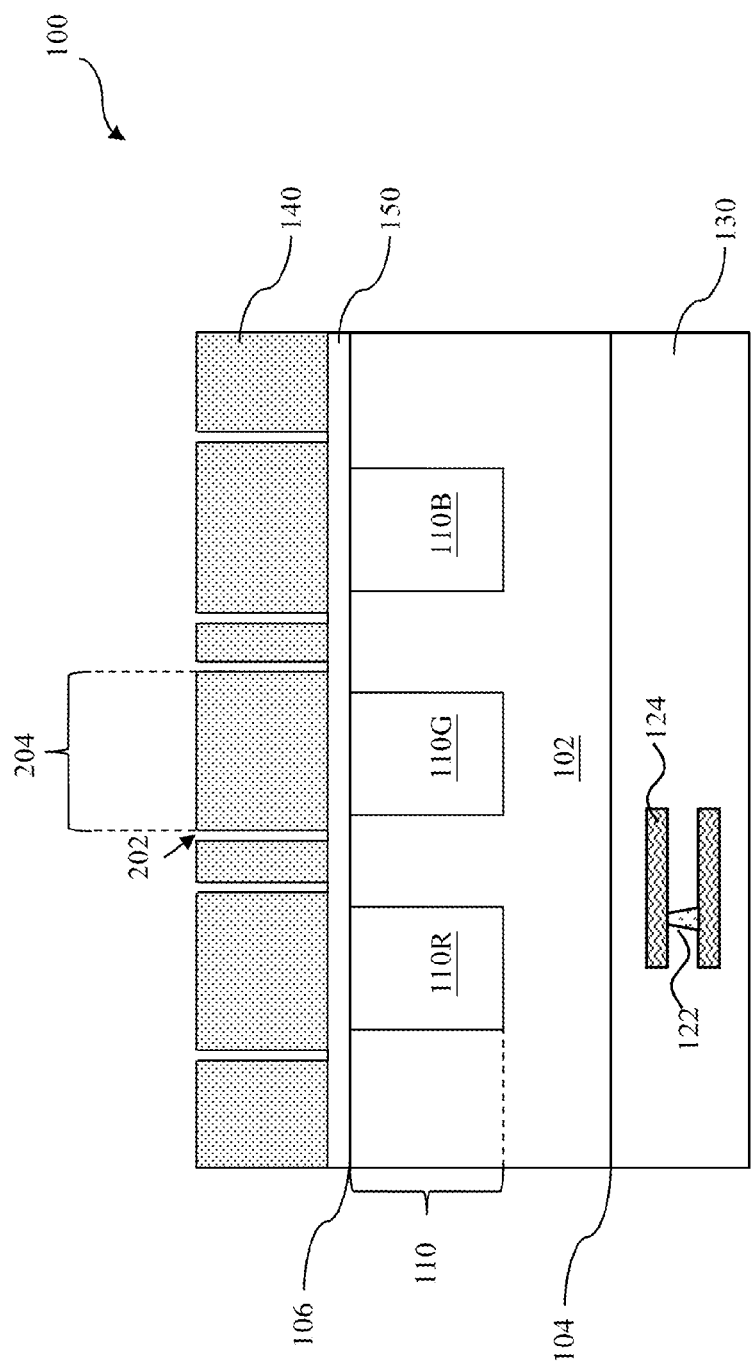

Referring to FIGS. 3 and 4B, the method 300 proceeds to step 306 by removing a portion of dielectric layer 140 to form a trench 202 in dielectric layer 140. In some embodiments, after forming dielectric layer 140 over back surface 106 of substrate 102, dielectric layer 140 may be subjected to a lithography patterning process and an etching process to form trench 202. The lithography patterning process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, or ion-beam writing. In yet another example, the lithography patterning process may implement nanoimprint technology. The etching processes may include dry etching, wet etching, and/or other etching methods. In some examples, the lithography and etching process may extend trench 202 in dielectric layer 140 to antireflective layer 150.

Figure 4C:
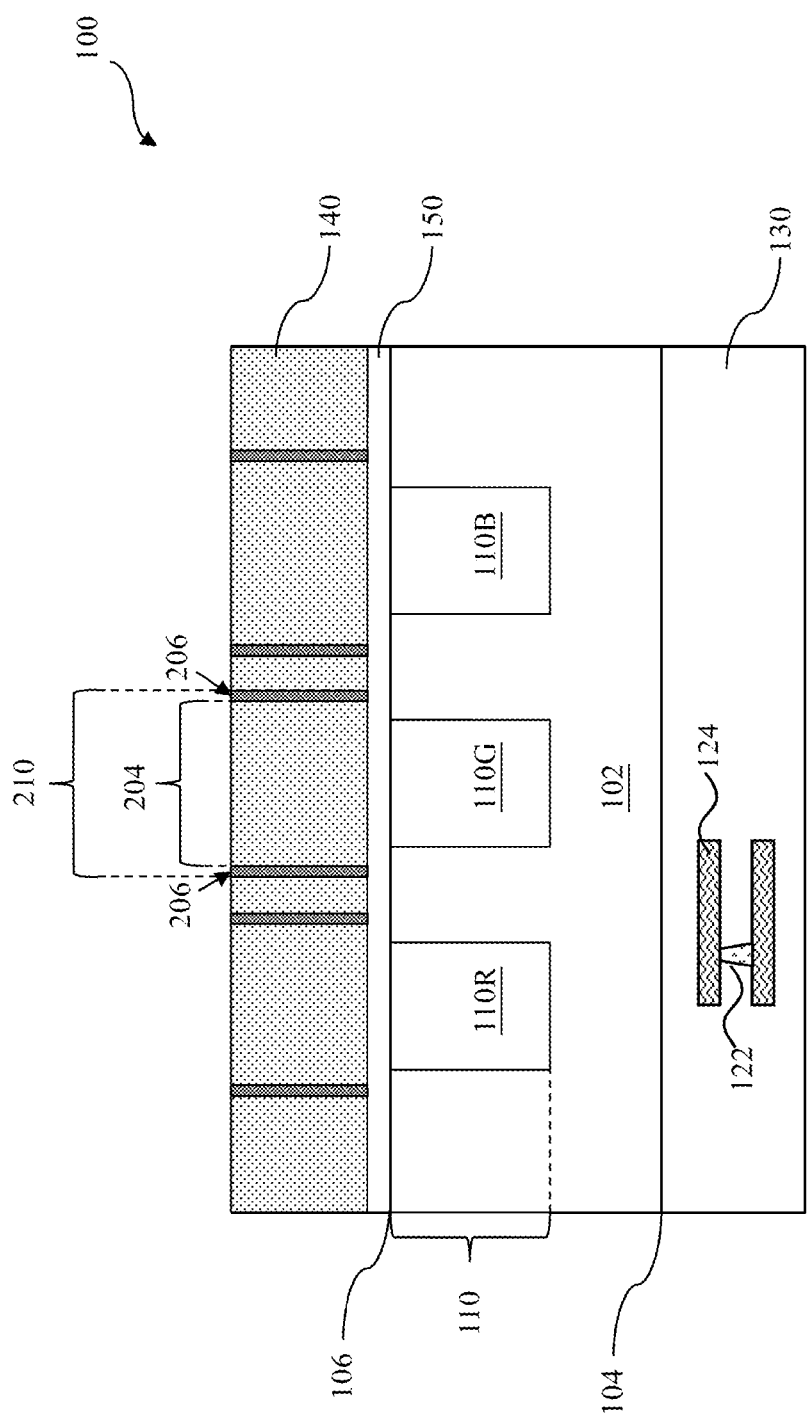

Referring to FIGS. 3 and 4C, the method 300 proceeds to step 308 by filling the trench 202 with a second dielectric material to form a waveguide wall 206. Two adjacent waveguide walls 206 and an inner region 204 between the two adjacent waveguide walls 206 form a waveguide 210. Waveguide 210 is aligned with a sensing region (e.g., sensing region 110G) such that waveguide 210 is operable to transmit the radiation towards aligned sensing region 110G. The refractive index ($n_1$) of the first dielectric material may be essentially the same or greater than the refractive index ($n_2$) of the second dielectric material. Waveguide wall 206 may be formed by CVD, PVD, ALD, or other suitable methods, and/or combinations thereof. In some embodiments, an etching back process, such as chemical mechanical polishing (CMP) is applied to remove the excessive material and planarize a top surface of dielectric layer 140. The second dielectric material of waveguide wall 206 may include silicon oxide, silicon nitride, or other suitable films.

Figure 4D:
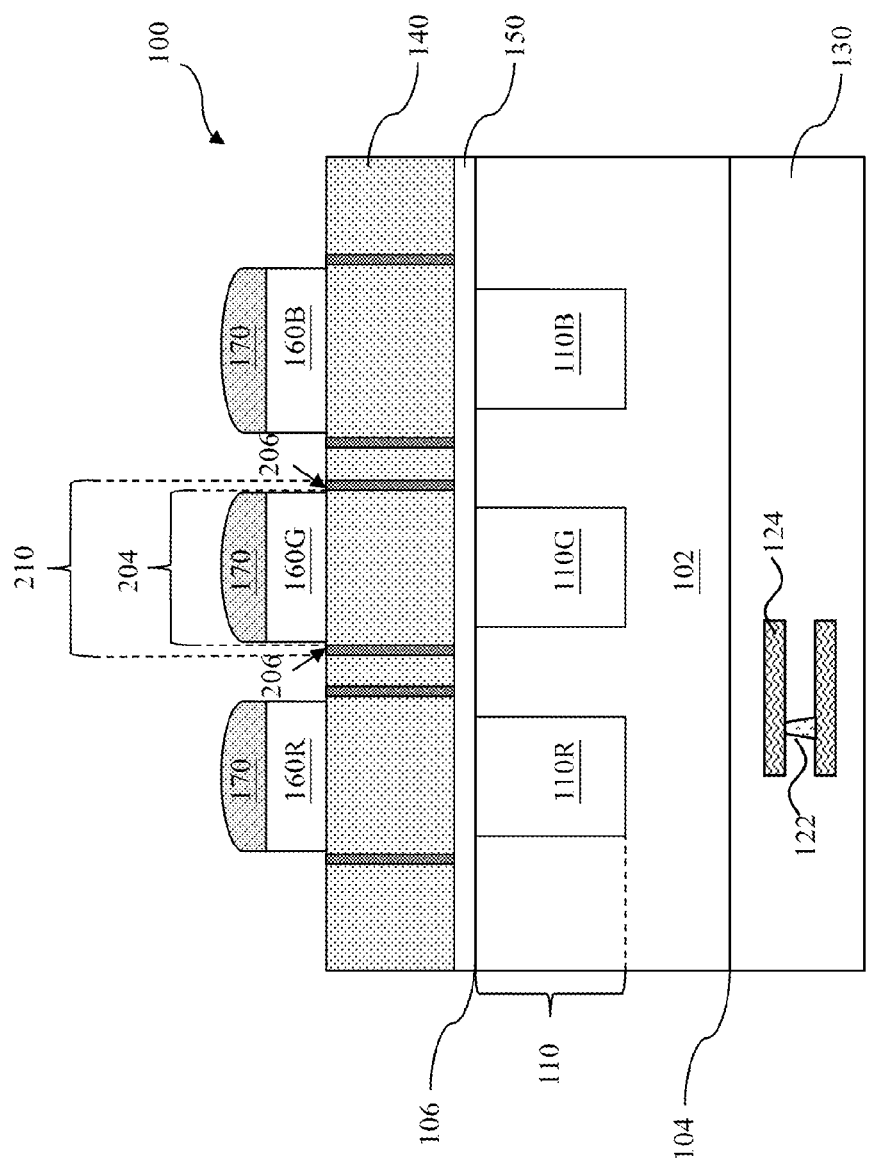

Referring to FIGS. 3 and 4D, the method 300 proceeds to step 310 by forming a color filter 160 (e.g., color filter 160G) aligned with and over waveguide 210. After forming waveguide 210, one or more color filters 160 (e.g., color filter 160G) may be formed above dielectric layer 140. Color filter 160 (e.g., color filter 160G) may be positioned to be aligned with a corresponding waveguide 210 and a sensing region (e.g., sensing region 110G). In some embodiments, one or more lenses 170 are further formed over one or more color filters 160, respectively.

In some embodiments, a capping layer may be deposited over dielectric layer 140 as a moisture resistant layer before forming color filters 160 and/or lenses 170. The capping layer may include TaO, ZrO, LaO AlO, or other suitable materials. The capping layer may be formed by processes of deposition, lithography and etching.

The present disclosure provides an integrated circuit device. The integrated circuit device includes a substrate having a back surface; a sensing region disposed in the substrate and being operable to sense radiation projected towards the back surface of the substrate; and a waveguide disposed over the back surface of the substrate. The waveguide is aligned with the sensing region such that the waveguide is operable to transmit the radiation towards the aligned sensing region. The waveguide includes a waveguide wall and an inner region disposed adjacent to the waveguide wall. A diffractive index of the waveguide wall is less than a diffractive index of the inner region.

The present disclosure also provides a method for fabricating an integrated circuit device. The method includes providing a substrate having a back surface; forming a dielectric layer over the back surface of the substrate, the dielectric layer including a first dielectric material; removing a portion of the dielectric layer to form a trench; filling the trench with a second dielectric material to form the waveguide wall; and forming a color filter aligned with and over the waveguide. A sensing region is disposed in the substrate and operable to sense radiation projected towards the back surface of the substrate. Two adjacent waveguide walls and an inner region between the adjacent waveguide walls form a waveguide. The waveguide aligned with the sensing region such that the waveguide is operable to transmit the radiation towards the aligned sensing region. The second dielectric material has a smaller diffractive index than the first dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device comprising:
    a substrate having a back surface;
    a sensing region disposed in the substrate and operable to sense radiation projected towards the back surface of the substrate;
    a waveguide disposed over the back surface of the substrate, the waveguide being aligned with the sensing region such that the waveguide is operable to transmit the radiation towards the aligned sensing region;
    a color filter disposed over and aligned with the waveguide; and
    a lens disposed over and aligned with the color filter and the sensing region,
        wherein the waveguide includes a pair of waveguide walls, and an inner region disposed adjacent to and between the waveguide walls,
        wherein the color filter is disposed over the inner region such that it does not extend directly over the pair of waveguide walls,
        wherein the lens is disposed over the inner region such that it does not extend directly over the pair of waveguide walls, and
        wherein a diffractive index of the waveguide walls is less than a diffractive index of the inner region.

2. The integrated circuit device of claim 1, wherein a width of the inner region is greater than a width of the aligned color filter.

3. The integrated circuit device of claim 1, wherein a width of the inner region is greater than a width of the aligned sensing region.

4. The integrated circuit device of claim 1, wherein each of the waveguide walls has multiple layers.

5. The integrated circuit device of claim 1, further comprising:

an antireflective layer disposed between the back surface of the substrate and the waveguide.

6. The integrated circuit device of claim 5, wherein the antireflective layer continuously extends underneath the inner region and the pair of waveguide walls.

7. The integrated circuit device of claim 1, further comprising:
a dielectric layer, wherein the waveguide is disposed in the dielectric layer.

8. The integrated circuit device of claim 7, wherein the dielectric layer and the inner region of the waveguide have the same dielectric material.

9. The integrated circuit device of claim 1, wherein each wall of the pair of waveguide walls includes:
a first layer extending uninterrupted from the substrate to a topmost surface of the respective waveguide wall and disposed towards the inner region;
a second layer extending from the substrate to a first height and disposed away from the inner region; and
a third layer disposed on the second layer and different in composition from the second layer, wherein the third layer extends from the first height to the topmost surface of the respective waveguide wall.

10. The integrated circuit device of claim 1, wherein a width of the inner region is greater than a width of the lens.

11. An integrated circuit device comprising:
a substrate having a back surface;
a waveguide disposed over the back surface of the substrate,
wherein the waveguide includes a pair of waveguide walls, and an inner region disposed adjacent to and between the waveguide walls, and
wherein a diffractive index of the waveguide walls is less than a diffractive index of the inner region;
a color filter aligned with and disposed over the waveguide such that the color filter does not extend directly over the pair of waveguide walls; and
a lens disposed on the color filter such that the lens does not extend directly over the pair of waveguide walls.

12. The integrated circuit device of claim 11, further comprising:
a sensing region disposed in the substrate and aligned with the waveguide such that the waveguide is operable to transmit radiation towards the aligned sensing region.

13. The integrated circuit device of claim 11, wherein a width of the inner region is greater than a width of the color filter.

14. The integrated circuit device of claim 11, wherein at least one of the waveguide walls has multiple layers.

15. The integrated circuit device of claim 11, wherein each wall of the pair of waveguide walls includes:
a first layer extending uninterrupted from a bottommost surface of the respective waveguide wall to a topmost surface of the respective waveguide wall and disposed towards the inner region;
a second layer extending from the bottommost surface of the respective waveguide wall to a first height and disposed away from the inner region; and
a third layer disposed on the second layer and different in composition from the second layer, wherein the third layer extends from the first height to the topmost surface of the respective waveguide wall.

16. The integrated circuit device of claim 11 further comprising an antireflective layer disposed between the waveguide and the substrate and that continuously extends underneath the inner region and the pair of waveguide walls.

17. A method comprising:
providing a substrate having a back surface, wherein a sensing region is disposed in the substrate and operable to sense radiation projected towards the back surface of the substrate;
forming a dielectric layer over the back surface of the substrate, the dielectric layer including a first dielectric material;
removing a portion of the dielectric layer to form a trench;
filling the trench with a second dielectric material to form a waveguide wall,
wherein two adjacent waveguide walls and an inner region between the adjacent waveguide walls form a waveguide, the waveguide aligned with the sensing region such that the waveguide is operable to transmit the radiation towards the aligned sensing region, and
wherein the first dielectric material has a greater diffractive index than the second dielectric material; and
forming a color filter aligned with and over the waveguide, wherein the color filter is disposed over the inner region and does not extend directly over the two adjacent waveguide walls.

18. The method of claim 17, wherein filling the trench includes filling the trench with multiple layers.

19. The method of claim 17, wherein a width of the waveguide is greater than a width of the aligned color filter.

20. The method of claim 17, further comprising:
forming a lens over the color filter.

* * * * *